(12) United States Patent
Coffy et al.

(10) Patent No.: US 8,482,116 B2
(45) Date of Patent: Jul. 9, 2013

(54) SEMICONDUCTOR DEVICE HAVING STACKED COMPONENTS

(75) Inventors: Romain Coffy, Saint Martin le Vinoux (FR); Remi Brechignac, Grenoble (FR); Carlo Cognetti de Martiis, Milan (IT)

(73) Assignees: STMicroelectronics (Grenoble 2) SAS, Grenoble (FR); STMicroelectronics S.r.l., Agrate Brianza (Milano) (IT)

( * ) Notice: Subject to any disclaimer, the term of this patent is extended or adjusted under 35 U.S.C. 154(b) by 0 days.

(21) Appl. No.: 13/130,169

(22) PCT Filed: Nov. 10, 2009

(86) PCT No.: PCT/EP2009/064918
§ 371 (c)(1),
(2), (4) Date: Jun. 15, 2011

(87) PCT Pub. No.: WO2010/057808
PCT Pub. Date: May 27, 2010

(65) Prior Publication Data
US 2011/0248397 A1   Oct. 13, 2011

(30) Foreign Application Priority Data
Nov. 24, 2008 (FR) ...................................... 08 57965

(51) Int. Cl.
*H01L 23/04* (2006.01)
(52) U.S. Cl.
USPC .... 257/698; 257/723; 257/778; 257/E23.067; 257/E23.125; 257/E23.128; 257/E21.499; 438/106; 438/108

(58) Field of Classification Search
USPC .......... 257/723, 777, 698, E23.067, E23.125, 257/E23.128, 778, E27.137, E27.144, E27.161, 257/686, 773, E21.499, E21.511, E21.705, 257/E23.174, E25.006; 438/109, 106, 108
See application file for complete search history.

(56) References Cited

U.S. PATENT DOCUMENTS 7,176,506 B2 *   2/2007   Beroz et al. .................... 257/232
7,285,728 B2 *  10/2007   Sunohara et al. ............. 174/260

(Continued)

FOREIGN PATENT DOCUMENTS

DE    102005043557 A1    9/2006
EP       1615264 A2      1/2006

(Continued)

OTHER PUBLICATIONS

INPI Search Report for FR 0857965 mailed Jul. 1, 2009 (2 pages).

(Continued)

*Primary Examiner* — Jasmine Clark
(74) *Attorney, Agent, or Firm* — Gardere Wynne Sewell LLP

(57) ABSTRACT

A semiconductor device includes at least one first component (5) (for example, a first integrated circuit), having a front face provided with electrical connection pads. The first component is embedded in a support layer (2) is a position such that the front face of the first component is not covered and lies parallel to a first face of the support layer. An intermediate layer (8) is formed on the front face of the first component and on the first face of the support layer. An electrical connection network (9) within the intermediate layer selectively connects to the electrical connection pads of the first component. The device further includes at least one second component (11) (for example, a second integrate circuit, having one face placed above the intermediate layer and provided with electrical connection pads selectively connected to the electrical connection network. Electrical connection vias (17) pass through the support layer and selectively connect the electrical connection network to an external electrical connection formed on a second face of the support layer.

17 Claims, 1 Drawing Sheet

U.S. PATENT DOCUMENTS

| | | | |
|---|---|---|---|
| 7,321,164 B2 * | 1/2008 | Hsu | 257/686 |
| 7,655,502 B2 * | 2/2010 | Mangrum et al. | 438/106 |
| 2004/0203244 A1 | 10/2004 | Oshima | |
| 2007/0246813 A1 | 10/2007 | Ong et al. | |

FOREIGN PATENT DOCUMENTS

| | | |
|---|---|---|
| WO | WO 02/33751 A2 | 4/2002 |
| WO | WO-2008/057895 A1 | 5/2008 |

OTHER PUBLICATIONS

International Search Report for PCT/EP2009/064918 mailed Jan. 29, 2010 (3 pages).

Palm, Petteri, et al.: "Integrated Module Board (IMB); an Advanced Manufacturing Technology for Embedding Active Components Inside Organic Substrate," 2004 Electronic Components and Technology Conference, pp. 1227-1231.

* cited by examiner

SEMICONDUCTOR DEVICE HAVING STACKED COMPONENTS

TECHNICAL FIELD

The present invention relates to the field of semiconductor devices.

BACKGROUND

Stacks of integrated-circuit chips are known in which a first integrated-circuit chip is mounted via one face on an electrical connection plate and a second integrated-circuit chip is bonded directly to the other face of the first chip. In such a case, that face of the first chip adjacent to the plate has electrical connection pads connected to the network of the plate via electrical connection balls. In another case, that face of the first chip opposite the plate has electrical connection pads placed on the periphery of the second chip and connected to the network of the plate via electrical connection wires. In both cases, the electrical connection pads for connecting the second chip that are provided on its face opposite that which is bonded are connected to the network of the plate via electrical connection wires. The chips and the electrical connection wires are then encapsulated either in a package mounted on the plate or in a molded encapsulation material. The arrangement in the first case is not very suitable when the second chip is larger than the first chip. In the arrangement in the second case, the second chip is necessarily smaller than the first chip.

There is a need in the art to provide a stack of components in which there may be great freedom in the dimensions of the components and in producing electrical connections between the components and with the outside.

SUMMARY

A semiconductor device comprises at least one first component, in particular at least one first integrated-circuit chip, having a front face provided with electrical connection pads. The first component is embedded in a support layer in a position such that the front face of the first component is not covered and lies parallel to a first face of the support layer and such that the rear face of the first component is covered. An intermediate layer is formed on the front face of the first component and on the first face of the support layer, said intermediate layer comprising an electrical connection network selectively connected to the electrical connection pads of the first component. At least one second component, in particular at least one second integrated-circuit chip, has one face placed above the intermediate layer and is provided with electrical connection pads selectively connected to the electrical connection network. Electrical connection vias pass through the support layer and selectively connect said electrical connection network to external electrical connection means formed on a second face of the support layer.

The device may comprise another layer formed on the second face of the support layer and comprising another electrical connection network which are selectively connected to said vias and having external electrical connection zones.

The device may comprise several first components embedded in the support layer.

The device may comprise several second components placed on the support layer.

The support layer may be made of a molded material.

In an embodiment, an electronic equipment comprises at least one abovementioned semiconductor device and an electrical connection support plate on which this semiconductor device is mounted via electrical connection balls.

In an embodiment, a semiconductor device comprises: a first integrated-circuit chip having a front face provided with electrical connection pads, a rear face, and side faces; a support layer within which the rear face and side faces of the first integrated-circuit chip are embedded, the support layer having a front face and a rear face; a plurality of interconnection vias passing through the support layer from the front face thereof to the rear face thereof; a first interconnection layer having a front face and a rear face, the rear face thereof being mounted to both the front face of the integrated-circuit chip and the front face of the support layer, the first interconnection layer electrically interconnecting the electrical connection pads of the first integrated-circuit chip to the plurality of interconnection vias; and a second interconnection layer having a front face and a rear face, the front face thereof being mounted to the rear face of the support layer, the second interconnection layer electrically interconnecting the plurality of interconnection vias to rear face electrical connection zones.

In another embodiment, a semiconductor device comprises: a first integrated-circuit chip having a front face provided with electrical connection pads; a second integrated-circuit chip having a rear face provided with electrical connection pads; a support layer having a front face and a rear face, wherein the first integrated-circuit chip is embedded within the support layer such that the front face of the first integrated-circuit chip is not covered and lies parallel to the front face of the support layer and such that the rear face of the first component is covered; a plurality of electrical connection vias passing through the support layer; and a first interconnection layer formed on the front face of the first integrated-circuit chip and on the first face of the support layer, the second integrated circuit chip being mounted to the front face of the first interconnection layer, said first interconnection layer including an electrical connection network which interconnects among and between the electrical connection pads of the first integrated-circuit chip; the electrical connection pads of the second integrated-circuit chip and the plurality of electrical connection vias.

A process of manufacturing semi-conductor devices can include:

bonding front face of a first integrated-circuit chip on a receiving surface of a cavity of a mould, at a distance apart, the front face having electrical connection pads, pouring a material in the cavity of the mould so as to obtain a support layer in which the first integrated-circuit chip is encapsulated, the front face of the first integrated-circuit chip being not covered and extended parallel to a front face of the support layer, making an intermediate layer on the front face of the support layer and the front face of the first integrated-circuit chip and including an electrical connection network, and also vias through the plate, the electrical connection network being selectively connected to the vias and the electrical connection pads of the first integrated-circuit chip, and mounting a second integrated-circuit chip on the intermediate layer, the second integrated-circuit chip having electrical connection pads connected selectively to the electrical connection network.

A process can include further making another layer on the rear face of the support layer, including another electrical connection network, this network being connected selectively to the vias and having external connecting pads.

BRIEF DESCRIPTION OF THE DRAWINGS

Semiconductor devices will now be described by way of non-limiting examples and illustrated by the appended drawings in which.

DETAILED DESCRIPTION OF THE DRAWINGS

Figure 1:
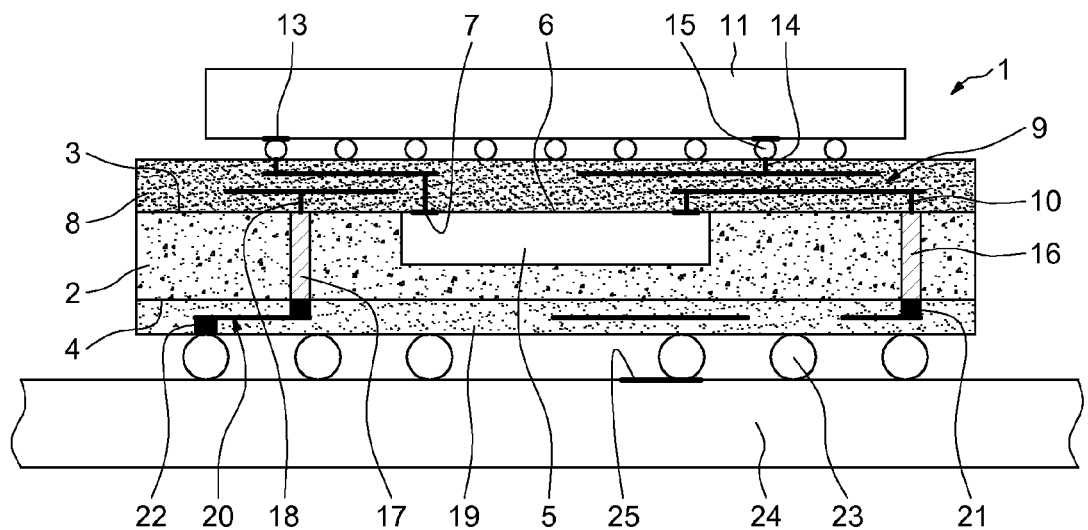
FIG. 1 represents a cross section through a semiconductor device.

In the example shown in FIG. 1, a semiconductor device 1 comprises a support layer 2, made of an insulating material, which has a front face 3 and a rear face 4. A first integrated-circuit chip 5, as a component, is embedded in the support layer 2 in a position such that the front face 6 of the first chip 5, which is provided with electrical connection pads 7, is not covered by the material of the support layer 2 and lies approximately in the same plane as the front face 3 of this support layer 2 and such that the rear face of the first integrated-circuit chip 5 is covered.

The semiconductor device 1 further includes an intermediate layer 8 formed on the front face of the support layer 2 and on the front face 6 of the first chip 5, at least partly on these faces. The intermediate layer 8 comprises an electrical connection network 9. This network 9 has, on a rear face, electrical connection zones 10 selectively connected to the electrical connection pads 7 of the first chip 5.

The semiconductor device 1 also includes a second, mounted integrated-circuit chip 11, as a component, having a face 12 placed above the intermediate layer 8, which may or may not be in contact with said intermediate layer, and provided with electrical connection pads 13. The network 9 has, on the front face, electrical connection zones 14 selectively connected to the electrical connection zones 13 of the second chip 11, for example via balls 15. In one embodiment, these balls could be replaced with zones protruding from the front face of the support layer 2. The device may comprise a single metallization level or several metallization levels, which are selectively connected and formed in an insulating material.

The support layer 2 has through-holes 16 in which electrical connection vias 17 are formed. These vias 17 are selectively connected to electrical connection zones 18 of the network 9 for the purpose of making external electrical connections via the rear of the support layer 2. The electrical connection vias 17 may be placed at any desired points around the first chip 5.

The semiconductor device 1 may also include another layer 19 comprising another electrical connection network 20 formed on the rear face 4 of the support layer 2, with one or more levels. This other network 20 may have front electrical connection zones 21 selectively connected to the vias 17 and exposed rear electrical connection zones 22, for the purpose of electrically connecting the semiconductor device 1 to an external component, for example via electrical connection balls 23 on the opposite side from the second chip 11.

In one example, the first chip 5 could be a microprocessor and the second chip could be an electronic memory, the networks 9 and 20 being adapted so as to provide the desired exchanges between the microprocessor and the memory and the desired exchanges between the latter components and the outside.

According to one embodiment, the semiconductor device 1 may be fabricated in the following manner.

The faces 6 of a plurality of first chips 5 are bonded to a receiving surface of a mould, at a certain distance apart and in a regular matrix.

A material having to form the support layer 2, for example an epoxy resin, is poured into the mould onto the first chips 5 so as to embed them, the sides faces and the rear faces of the first chips 5 being covered by the material and the front face of the first chips 5 being not covered and lied parallel to the front face of the support layer or in the same plane. After the material has been cured, a plate is obtained which is extracted from the mould.

The electrical connection networks 9 and 20 and the vias 17 are produced, by implementing the usual techniques for forming metal tracks and metal connection zones, on one or more levels.

The second chip 11 is mounted on the intermediate layer 8, employing the usual surface mounting techniques.

The plate obtained is then cut up so as to form a plurality of individual semiconductor devices 1.

The semiconductor devices 1 obtained are then mounted on electrical connection support plates 24 of electronic equipment via balls 23 connected to tracks or pads 25 on these plates.

Figure 2:
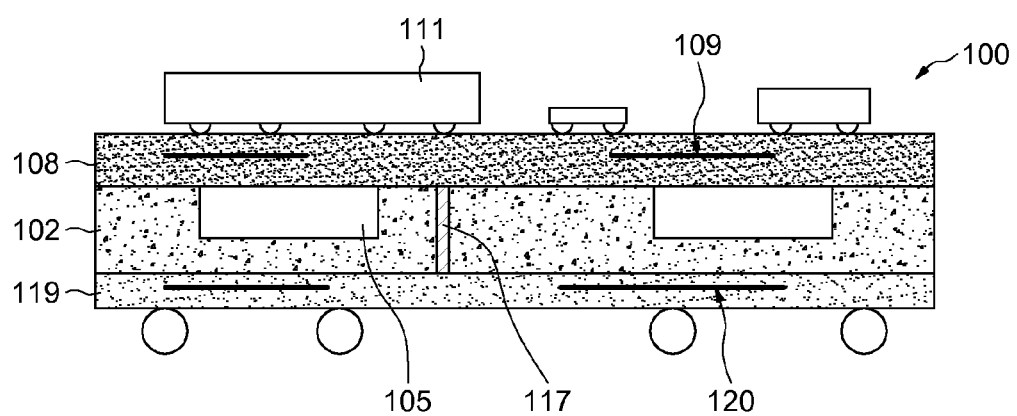
FIG. 2 represents a cross section through a semiconductor device.

In the example shown in FIG. 2, a semiconductor device 100 comprises a plurality of first components 105 embedded in a support layer 102, an intermediate layer 108 comprising an electrical connection network 109, a plurality of second components 111 placed on the intermediate layer 108 and surface-mounted or connected thereto, vias 17 through the support layer 102, and another layer 119 comprising another electrical connection network 120.

The first components 105 may be electronic chips and/or any other active or passive components, of identical or different dimensions, both in terms of footprints and thicknesses.

Likewise, the second components 111 may be electronic chips and/or any other active or passive components, which are identical or different both in terms of footprints and thicknesses.

The networks 109 and 120 and the vias 117 may be adapted so as to make the desired exchanges between the components 105 and 111 and the desired exchanges between the said components and the outside.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. A semiconductor device comprising:
   a first integrated-circuit chip having a rear face and side faces and a front face provided with electrical connection pads;
   a single support layer within which the first integrated-circuit chip is encapsulated in a position such that the front face of the first integrated-circuit chip is not covered by the single support layer and lies parallel to a first face of the single support layer and such that the rear face and side surfaces of the first integrated-circuit chip are covered by the single support layer;
   an intermediate layer placed on the front face of the first integrated-circuit chip and on the first face of the single support layer, the intermediate layer comprising an electrical connection network selectively connected to the electrical connection pads of the first integrated-circuit chip;

a second integrated-circuit chip having one face placed above the intermediate layer and provided with electrical connection pads selectively connected to the electrical connection network; and electrical connection vias passing through the single support layer and selectively connecting the electrical connection network to external electrical connection means formed on a second face of the single support layer.

2. The device according to claim 1, comprising another layer formed on the second face of the single support layer and comprising another electrical connection network which are selectively connected to the vias and having external electrical connection zones.

3. The device according to claim 1, comprising several first integrated-circuit chips embedded in the single support layer.

4. The device according to claim 1, comprising several second integrated circuit chips placed on the intermediate layer.

5. The device according to claim 1, in which the single support layer is made of a molded material.

6. The device according to claim 2, further comprising an electrical connection support plate to which the another layer is mounted via electrical connection balls.

7. A semiconductor device comprising:
a first integrated-circuit chip having a front face provided with electrical connection pads, a rear face, and side faces;
a single support layer within which the rear face and side faces of the first integrated-circuit chip are embedded, the single support layer having a front face and a rear face;
a plurality of interconnection vias passing through the single support layer from the front face thereof to the rear face thereof;
a first interconnection layer having a front face and a rear face, the rear face thereof being mounted to both the front face of the integrated-circuit chip and the front face of the single support layer, the first interconnection layer electrically interconnecting the electrical connection pads of the first integrated-circuit chip to the plurality of interconnection vias;
a second interconnection layer having a front face and a rear face, the front face thereof being mounted to the rear face of the single support layer, the second interconnection layer electrically interconnecting the plurality of interconnection vias to rear face electrical connection zones; and
a second integrated-circuit chip having a rear face provided with rear face electrical connection zones, the second integrated-circuit chip being mounted to the front face of the first interconnection layer, the first interconnection layer electrically interconnecting the rear face electrical connection zones of the second integrated-circuit chip to the electrical connection pads on the front face of the first integrated-circuit chip.

8. The device of claim 7 further comprising an additional component having a rear face being mounted to the front face of the first interconnection layer, the first interconnection layer electrically interconnecting the rear face of the additional component to the electrical connection pads on the front face of the first integrated-circuit chip.

9. The device of claim 7, further comprising an electrical connection support plate to which the rear face of the second interconnection layer is mounted via electrical connection balls and the rear face electrical connection zones of the second interconnection layer.

10. A semiconductor device comprising:
a first integrated-circuit chip having a rear face and side faces and a front face provided with electrical connection pads;
a second integrated-circuit chip having a rear face provided with electrical connection pads;
a single support layer having a front face and a rear face, wherein the first integrated-circuit chip is embedded within the single support layer molded around the first integrated-circuit chip such that the front face of the first integrated-circuit chip is not covered by the single support layer and lies parallel to the front face of the single support layer and such that the rear face and side faces of the first integrated-circuit chip is are covered by the single support layer;
a plurality of electrical connection vias passing through the single support layer; and
a first interconnection layer formed on the front face of the first integrated-circuit chip and on the first face of the single support layer, the second integrated circuit chip being mounted to the front face of the first interconnection layer, the first interconnection layer including an electrical connection network which interconnects among and between the electrical connection pads of the first integrated-circuit chip; the electrical connection pads of the second integrated-circuit chip and the plurality of electrical connection vias.

11. The device of claim 10 further comprising an additional component having a rear face being mounted to the front face of the first interconnection layer, the electrical connection network of the first interconnection layer interconnecting among and between the electrical connection pads of the first integrated-circuit chip; the electrical connection pads of the second integrated-circuit chip, the rear face of the additional component and the plurality of electrical connection vias.

12. The device of claim 10 further comprising a second interconnection layer having a front face and a rear face, the front face thereof being mounted to the rear face of the single support layer, the second interconnection layer electrically interconnecting the plurality of interconnection vias to rear face electrical connection zones.

13. The device of claim 12, further comprising an electrical connection support plate to which the rear face of the second interconnection layer is mounted via electrical connection balls and the rear face electrical connection zones of the second interconnection layer.

14. The device of claim 10, comprising several first integrated-circuit chips embedded in the single support layer.

15. The device of claim 14, comprising several second integrated circuit chips mounted to the front face of the first interconnection layer.

16. A process of manufacturing a semi-conductor device including:
bonding a front face of a first integrated-circuit chip on a receiving surface of a cavity of a mold, the front face having electrical connection pads,
pouring a material in the cavity of the mold so as to obtain a support layer in which the first integrated-circuit chip is encapsulated therein, the front face of the first integrated-circuit chip being not covered by the material and extending parallel to a front face of the support layer, thereby obtaining a plate when the material has cured, forming an intermediate layer on the front face of the support layer and the front face of the first integrated-circuit chip which includes an electrical connection network, forming vias through the plate, wherein the electrical connection network is selectively connected to the vias and the electrical connection pads of the first integrated-circuit chip, and mounting a second integrated-circuit chip on the intermediate layer, the second integrated-circuit chip having electrical connection pads connected selectively to the electrical connection network.

17. A process according to the claim 16, further including:

forming another layer on the rear face of the support layer, including another electrical connection network, the network being connected selectively to the vias and having external connecting pads.

\* \* \* \* \*